March 26, 1968 D. K. MILLER 3,375,460

FEEDBACK AMPLIFIER HAVING AN INPUT CURRENT LIMITING CIRCUIT

Filed Aug. 4, 1965

INVENTOR
DONALD K. MILLER

BY Q. C. Smith

ATTORNEY

United States Patent Office 3,375,460

Patented Mar. 26, 1968

3,375,460
FEEDBACK AMPLIFIER HAVING AN INPUT CURRENT LIMITING CIRCUIT

Donald K. Miller, San Jose, Calif., assignor to Hewlett-Packard Company, Palo Alto, Calif., a corporation of California Filed Aug. 4, 1965, Ser. No. 477,165
4 Claims. (Cl. 330—51)

ABSTRACT OF THE DISCLOSURE

A feedback circuit is responsive to input signals below a first level of magnitude for reducing the input impedance of an amplifying circuit. This feedback circuit is inactivated and a feedback circuit for reducing the gain of an amplifier of the amplifying circuit is activated in response to input signals above the first level of magnitude. A current limiting circuit for preventing the amplifier from being saturated or biased to cutoff is responsive to input signals above a second and higher level of magnitude for decoupling the amplifier from those input signals.

This invention relates to feedback amplifiers.

It is the principal object of this invention to provide a low-level amplifier which is responsive to a wide range of input signals.

Another object of this invention is to provide an amplifier having a low input impedance for input signals of small amplitude, which amplifier automatically decouples from the source of input signals for input signals of greater amplitude.

In accordance with the illustrated embodiment of this invention there is provided a feedback amplifier comprising a gain element and an input current limiting circuit therefor. A feedback circuit is connected to reduce the input impedance of the feedback amplifier for input signals having less than a preselected magnitude. Another feedback circuit is connected to reduce the gain of the feedback amplifier for input signals having more than the preselected magnitude.

Other and incidental objects of this invention will become apparent from a reading of this specification and an inspection of the accompanying drawing in which.

Figure 1:
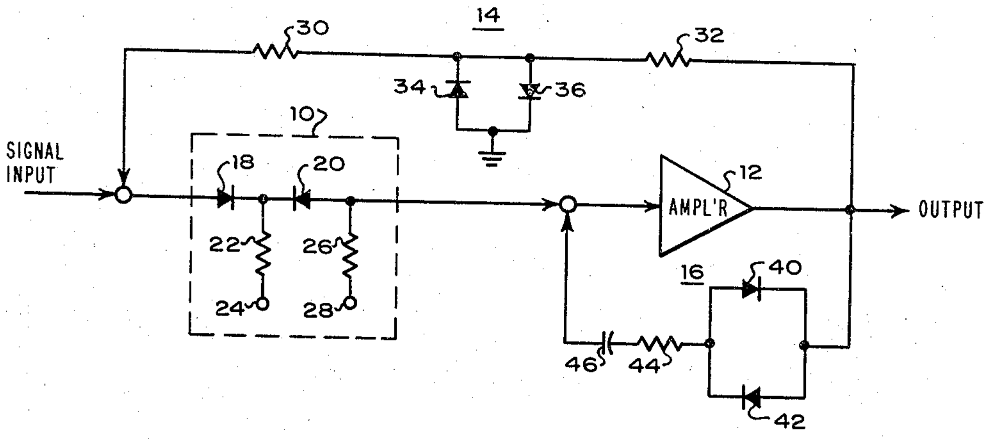
FIGURE 1 is a schematic diagram of a feedback amplifier according to one embodiment of this invention.

Referring now to FIGURE 1, there is shown an amplifying circuit comprising an input current limiting circuit 10, a high gain amplifier 12, and a pair of feedback circuits 14 and 16. The input current limiting circuit 10 includes a pair of diodes 18 and 20 serially connected in a common cathode configuration between the signal input of the amplifying circuit and the input of amplifier 12. A resistor 22 connects a source of bias voltage 24 to a point intermediate the common-connected cathodes of diodes 18 and 20, and a resistor 26 connects a source of more positive bias voltage 28 to the anode of diode 20. For any input signal, this current limiting circuit 10 prevents amplifier 12, which is connected thereto, from being saturated or biased to cutoff. One advantage of this current limiting circuit is that it is capable of operating over a large voltage range.

Feedback circuit 14 comprises resistors 30 and 32 which serially connect the output of amplifier 12 to the signal input of the amplifying circuit. This feedback circuit 14 provides the amplifying circuit with a low input impedance, which is desirable, for example, in pulsed sonar applications, for weak input signals. The cathode of diode 34 and the anode of diode 36 are connected in common to a point intermediate resistors 30 and 32 of feedback circuit 14, and the anode of diode 34 and the cathode of diode 36 are connected in common to ground. These diodes 34 and 36 are responsive to input signals which exceed a predetermined magnitude 38, as indicated in the transfer characteristic of FIGURE 2, for deactivating feedback circuit 14 to isolate the signal input from the output of amplifier 12. This deactivation of feedback circuit 14 correspondingly increases the input impedance of the amplifying circuit as shown in FIGURE 3.

Feedback circuit 16 comprises diodes 40 and 42, resistor 44, and capacitor 46. The cathode of diode 40 and the anode of diode 42 are connected in common to the output of amplifier 12. Similarly, the anode of diode 40 and the cathode of diode 42 are connected to resistor 44 which is connected in series with capacitor 46 to the input of amplifier 12. The value of resistor 44 is selected to be very much less than the value of the series combination of resistors 30 and 32 in feedback circuit 14. Diodes 40 and 42 are responsive to input signals which exceed the predetermined magnitude 38, shown in the transfer characteristic of FIGURE 2, for activating feedback circuit 16 which then reduces the gain of the feedback amplifying circuit, as indicated by the reduced slope of the transfer characteristic. It should be noted that by using dissimilar diodes in feedback circuits 14 and 16, it is possible to deactivate feedback circuit 14 and activate feedback circuit 16 at different levels.

Figure 2:
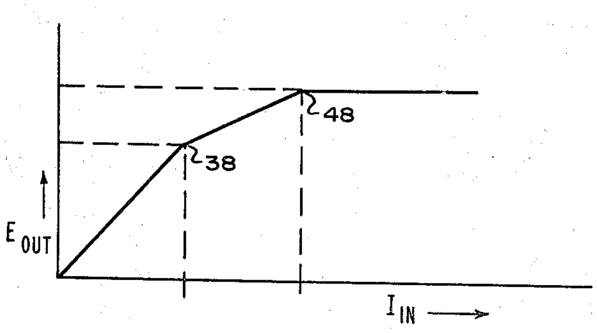
FIGURE 2 is an ideal plot of the transfer characteristic of the feedback amplifier of FIGURE 1.
Figure 3:
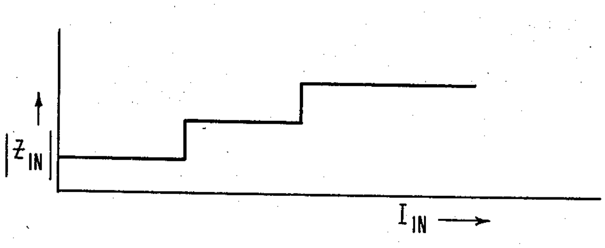
FIGURE 3 is an ideal plot of the absolute value of the input impedance of the feedback amplifier of FIGURE 1 versus input current.

For any input signal in excess of a predetermined magnitude 48, shown in FIGURE 2, the current limiting circuit 10 decouples the input of amplifier 12 from the signal input, leaving only resistor 30 (and sometimes resistor 22 depending on the polarity of the input signal) connected to ground. Thus, as indicated by the horizontal portion of the transfer characteristic, the amplifying circuit provides no gain, and the input impedance thereof correspondingly increases as shown in FIGURE 3.

I claim:

1. A feedback amplifying circuit for amplifying an input signal, said feedback amplifying circuit comprising:

an input for receiving the input signal;

an output;

an amplifier connected between said input and said output for amplifying the input signal;

a current limiting circuit connected between said input and said amplifier for limiting the current applied to said amplifier, said current limiting circuit including a first switching element serially connected between said input and said amplifier for electrically decoupling said amplifier from said input when the input signal exceeds a selected level of magnitude; and a first feedback circuit connected between said output and said input for decreasing the input impedance of the feedback amplifying circuit.

2. A feedback amplifying circuit as in claim 1 wherein said first feedback circuit includes a second switching element for deactivating said first feedback circuit when the input signal exceeds a selected level of magnitude.

3. A feedback amplifying circuit as in claim 2 including a second feedback circuit connected across said amplifier, said second feedback circuit being activated for decreasing the gain of said amplifier when the input signal exceeds a selected level of magnitude.

4. A feedback amplifying circuit as in claim 2 wherein:

said first switching element comprises a first diode;

said current limiting circuit includes a source of bias potential and a resistor connecting said source of bias potential to a point between said first diode and said amplifier;

said second switching element comprises a second diode; and said first feedback circuit includes a source of reference potential, said second diode connecting said source of reference potential to a point in said first feedback circuit between said input and said output.

References Cited

UNITED STATES PATENTS

| | | | |
|---|---|---|---|
| 3,041,535 | 6/1962 | Cochran | 330—110 X |
| 3,058,068 | 10/1962 | Hinrichs et al. | 330—10 |
| 3,237,002 | 2/1966 | Patmore | 330—110 X |
| 3,252,007 | 5/1966 | Saari | 328—142 X |

ROY LAKE, *Primary Examiner.*

J. B. MULLINS, *Assistant Examiner.*